United States Patent
Huh et al.

(10) Patent No.: US 8,084,105 B2
(45) Date of Patent: *Dec. 27, 2011

(54) METHOD OF DEPOSITING BORON NITRIDE AND BORON NITRIDE-DERIVED MATERIALS

(75) Inventors: Jeong-Uk Huh, Santa Clara, CA (US); Mihaela Balseanu, Sunnyvale, CA (US); Li-Qun Xia, Santa Clara, CA (US); Victor T. Nguyen, Novato, CA (US); Derek R. Witty, Fremont, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 593 days.

This patent is subject to a terminal disclaimer.

(21) Appl. No.: 11/765,257

(22) Filed: Jun. 19, 2007

(65) Prior Publication Data
US 2008/0292798 A1    Nov. 27, 2008

Related U.S. Application Data

(60) Provisional application No. 60/939,802, filed on May 23, 2007.

(51) Int. Cl.
    *H05H 1/24*    (2006.01)
(52) U.S. Cl. .................. 427/576; 427/535; 427/376.6
(58) Field of Classification Search ............ 427/255.29, 427/255.38, 255.394, 343, 569, 576, 535, 427/376.6; 117/88, 103
See application file for complete search history.

(56) References Cited

U.S. PATENT DOCUMENTS

| | | | |
|---|---|---|---|
| 3,451,840 A * | 6/1969 | Hough | 428/366 |
| 4,440,828 A * | 4/1984 | Resneau et al. | 428/334 |
| 4,656,052 A | 4/1987 | Satou et al. | |
| 5,270,125 A * | 12/1993 | America et al. | 428/698 |
| 5,306,530 A * | 4/1994 | Strongin et al. | 427/533 |
| 5,483,920 A | 1/1996 | Pryor | |

(Continued)

FOREIGN PATENT DOCUMENTS

JP        63-83273    *    4/1988

OTHER PUBLICATIONS

Ferguson, J.D., et al., "Atomic layer deposition of boron nitride using sequential exposures of BCl3 and NH3". Thin Solid Films 413 (2002), pp. 16-25.*

(Continued)

*Primary Examiner* — Bret Chen
(74) *Attorney, Agent, or Firm* — Patterson & Sheridan, L.L.P.

(57) ABSTRACT

Methods for forming boron-containing films are provided. The methods include introducing a boron-containing precursor and a nitrogen or oxygen-containing precursor into a chamber and forming a boron nitride or boron oxide film on a substrate in the chamber. In one aspect, the method includes depositing a boron-containing film and then exposing the boron-containing film to the nitrogen-containing or oxygen-containing precursor to incorporate nitrogen or oxygen into the film. The deposition of the boron-containing film and exposure of the film to the precursor may be performed for multiple cycles to obtain a desired thickness of the film. In another aspect, the method includes reacting the boron-containing precursor and the nitrogen-containing or oxygen-containing precursor to chemically vapor deposit the boron nitride or boron oxide film.

17 Claims, 2 Drawing Sheets

U.S. PATENT DOCUMENTS

| | | | |
|---|---|---|---|
| 5,534,070 A * | 7/1996 | Okamura et al. | 118/723 E |
| 5,536,360 A | 7/1996 | Nguyen et al. | |
| 5,626,922 A | 5/1997 | Miyanaga et al. | |
| 5,897,751 A | 4/1999 | Makowiecki et al. | |
| 6,165,891 A * | 12/2000 | Chooi et al. | 438/622 |
| 6,759,261 B2 | 7/2004 | Shimokohbe et al. | |
| 6,958,175 B2 | 10/2005 | Sakamoto et al. | |
| 7,704,816 B2 * | 4/2010 | Huh et al. | 438/197 |
| 2003/0082296 A1 * | 5/2003 | Elers et al. | 427/96 |
| 2003/0224217 A1 * | 12/2003 | Byun et al. | 428/698 |
| 2004/0175932 A1 * | 9/2004 | Kim et al. | 438/637 |
| 2006/0019486 A1 * | 1/2006 | Yu et al. | 438/628 |
| 2006/0207504 A1 | 9/2006 | Hasebe et al. | |
| 2007/0197028 A1 | 8/2007 | Byun et al. | |
| 2009/0263972 A1 * | 10/2009 | Balseanu et al. | 438/696 |
| 2010/0098884 A1 * | 4/2010 | Balseanu et al. | 427/577 |

OTHER PUBLICATIONS

Wank, Jeffrey R., et al., "Nanocoating individual cohesive boron nitride particles in a fluidized bed by ALD". Powder Technology 142 (2004), pp. 59-69.*

International Search Report and Written Opinion of the International Searching Authority mailed Aug. 8, 2008 (PCT/US08/63552).

* cited by examiner

METHOD OF DEPOSITING BORON NITRIDE AND BORON NITRIDE-DERIVED MATERIALS

CROSS-REFERENCE TO RELATED APPLICATIONS

This application claims benefit of U.S. Provisional Patent Application Ser. No. 60/939,802, filed May 23, 2007, which is herein incorporated by reference.

BACKGROUND OF THE INVENTION

1. Field of the Invention

Embodiments of the present invention generally relate to methods of forming films on substrates, such as semiconductor substrates. More particularly, embodiments of the present invention relate to methods for forming boron nitride films on substrates.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 µm and even 0.1 µm feature sizes, and tomorrow's facilities soon will be producing devices having even smaller feature sizes.

The continued reduction in device geometries has generated a demand for dielectric films having lower dielectric constant (k) values because the capacitive coupling between adjacent metal lines must be reduced to further reduce the size of devices on integrated circuits.

The continued reduction in device geometries and the increasingly dense spacing of devices on semiconductor substrates have also presented challenges in the area of improving device performance. For example, while the performance of a metal-oxide-semiconductor field effect transistor (MOSFET) device can be improved by several methods, such as reducing the gate dielectric thickness of the device, the very thin dielectric layers required by small devices may allow dopants from the gate electrode to penetrate through the gate dielectric into the underlying silicon substrate. A very thin gate dielectric may also increase gate leakage that increases the amount of power consumed by the gate and eventually damages the transistor.

Straining the atomic lattice of materials in devices is a recently developed, alternative method of improving device performance. Straining the atomic lattice improves device performance by increasing carrier mobility in a semiconductor material. The atomic lattice of one layer of a device can be strained by depositing a stressed film over the layer. For example, stressed silicon nitride layers used as etch stop layers over a gate electrode can be deposited to induce strain in the channel region of the transistor. The stressed silicon nitride layers can have compressive stress or tensile stress.

While plasma-enhanced chemical vapor deposited (PECVD) silicon nitride (SiN) layers having relatively high stress levels have been developed, there remains a need for a method for forming dielectric layers that have higher compressive or tensile stress levels and a lower dielectric constant (k) than SiN layers, which typically have a dielectric constant of about 7.

SUMMARY OF THE INVENTION

Embodiments of the present invention generally provide methods of forming boron-containing films, such as boron nitride films and boron oxide films. In one embodiment, a method of forming a boron nitride film or a boron oxide film comprises introducing a boron-containing precursor into a chamber and depositing a boron-containing film on a substrate in the chamber from the boron-containing precursor. The boron-containing film is treated to increase the nitrogen or oxygen content in the film and form a boron nitride film or boron oxide film. Treating the boron-containing film comprises exposing the boron-containing film to a nitrogen-containing precursor or an oxygen-containing precursor. Treating the boron-containing film may also comprise a plasma process, a UV cure process, a thermal anneal process, or a combination thereof. The introducing, depositing, and treating are repeated until a desired thickness of the boron nitride film or boron oxide film is obtained.

In another embodiment, a method of forming a boron nitride film or a boron oxide film comprises introducing a boron-containing precursor and a nitrogen-containing precursor or an oxygen-containing precursor into a chamber. The boron-containing precursor and the nitrogen-containing precursor or the oxygen-containing precursor are reacted to chemically vapor deposit a boron nitride film or boron oxide film on a substrate in the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
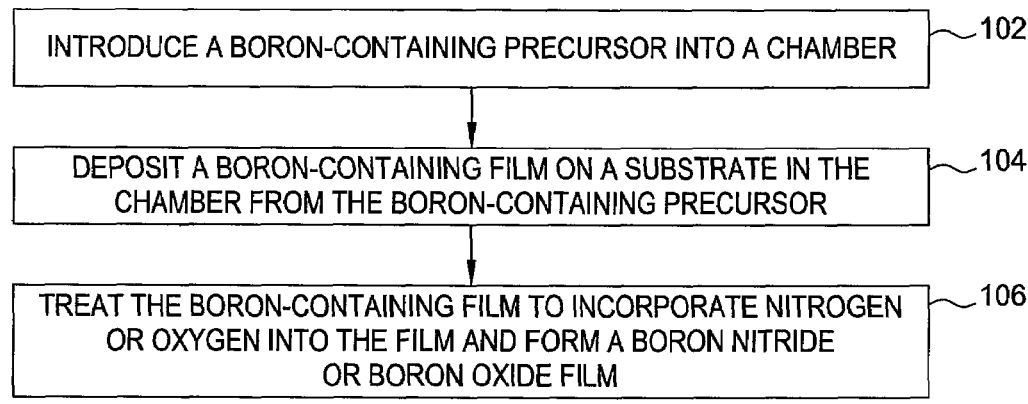
FIG. 1 is a flow chart of an embodiment of a method of forming a boron nitride or boron oxide film.

Embodiments of the present invention provide methods of depositing boron nitride, boron oxide and boron carbide films. The boron nitride, oxide and carbide films may be undoped boron nitride (BN), undoped boron oxide ($B_2O_3$) and undoped boron carbide (BC) films, or doped boron nitride, boron oxide or boron carbide films, such as boron silicon nitride (BSiN), boron silicon oxide (BSixOy), boron carbon nitride (BCN), phosphorus boron nitride (PBN), silicon boron nitride (SiBN) and boron carbon silicon nitride (BCSiN) films.

The boron nitride, boron carbide and boron oxide films may be used for front end applications, such as spacer layers and strain-inducing layers, i.e., a stress nitride layer, which is deposited to control the stress of an underlying film. The boron nitride films may have a dielectric constant between 1.1 and 10. For example, boron nitride films having a dielectric constant between 1.1 and 6.0 may be deposited by a deposition method comprising introducing the film precursors into a chamber simultaneously. The boron nitride films may be stress nitride layers having a stress between 10 GPa compressive and 10 GPa tensile, such as a tensile stress that is greater than about 2.0 GPa or a compressive stress that is less than about −3.5 GPa. The boron nitride films have a high step coverage and low pattern loading effect. As defined herein, films with a high step coverage have a lower percentage of film thickness difference between different surfaces of a feature, i.e., sidewalls, top, and bottom, than films with low step coverage. The pattern loading effect (PLE) is defined as the percentage of film thickness difference between a film thickness on portion, such as the bottom, top, or sidewall, of a feature in a substrate region with a few features (an isolated area) and a film thickness on a corresponding portion of a feature in a substrate region with high density of features (a dense area), and thus, a lower pattern loading effect percentage reflects a higher film thickness uniformity across a substrate.

The boron-containing films may also be used as a boron source layers for doping an underlying layer with boron. For example, a boron nitride film may be deposited on a silicon layer and then annealed in order to introduce boron into the silicon layer to form a shallow junction in the silicon layer. The boron nitride film may be removed after a desired amount of boron is introduced into the silicon layer.

Additional embodiments provide methods comprising depositing a boron nitride or boron oxide liner on a substrate before or after a boron-containing film is deposited on the substrate. The boron-containing film can be a high stress, boron-rich film. The deposition of the boron nitride or boron oxide liner on top of and/or underneath the boron-rich film prevents boron out-diffusion from the boron-rich film and reduces the leakage current through the boron-rich film. If the boron-rich film is used as a boron-diffusion source, the liner is deposited on the side of the film where the boron diffusion is not desired. For example, the liner may be deposited underneath a boron-rich film that is intended to dope a $SiO_2$ film deposited on top of the boron-rich film. In another example, the liner may be deposited on top of a boron-rich film that is used as a dopant source for the substrate (i.e., Si) underneath the boron-rich film.

The boron nitride or oxide liner that contacts the boron-rich film may be any of the boron nitride or oxide films provided according to embodiments of the invention. The boron nitride liner may also be deposited according to any of the methods provided herein for forming the boron nitride films (e.g., by plasma, thermal, or UV-assisted methods) with the exception that the boron nitride liner is deposited under conditions sufficient to provide a lower boron concentration in the liner relative to the boron-rich film. For example, the boron atomic percent concentration in the liner may be from between 0 and 90%, while the boron atomic percent concentration in the boron-rich films may be about 5% to about 99%. The liner may include oxygen, carbon or silicon. The liner may have a thickness of between about 2 Å and about 500 Å.

The boron-containing films may also be used for hard masks that may be sacrificial or left in structures after patterning. For example, the boron-containing films may be boron nitride or boron oxide films that are hard masks for etching oxide, nitride, silicon, polysilicon, or metal layers.

The boron-containing films may also be used for back end applications, such as copper barrier layers or as adhesion layers between copper and copper barrier layers, e.g., by forming CuBN, CuPBN, or CuBCSiN layers therebetween. The copper barrier layers or adhesion layers may have a dielectric constant between 1.1 and 4.0. The copper barrier layers may be used in conventional damascene structures or structures that include air gaps that are formed by depositing and then removing a sacrificial material.

Embodiments of a method of depositing a boron nitride film will be described with respect to the flow chart of FIG. 1. As shown in step 102, a boron-containing precursor is introduced into a chamber. In step 104, a boron-containing film is deposited on a substrate in the chamber from the boron-containing precursor. Then, in step 106, the boron-containing film is treated to modify the film composition (e.g., to increase the nitrogen or oxygen content of the film). Treating the boron-containing film comprises exposing the boron-containing film to a nitrogen-containing or oxygen-containing precursor.

Returning to step 102, the chamber into which the boron-containing precursor is introduced may be any chemical vapor deposition chamber or a plasma enhanced chemical vapor deposition chamber. Examples of chambers that may be used include the PRODUCER® SE and PRODUCER® GT PECVD chambers, both of which are available from Applied Materials, Inc. of Santa Clara, Calif. The processing conditions provided herein are provided for a 300 mm PRODUCER® SE chamber with two isolated processing regions, with one substrate per processing region. Thus, the flow rates experienced per each substrate processing region and substrate are half of the flow rates into the chamber.

The substrate on which the boron-containing film is deposited may be a silicon, silicon-containing, or glass substrate. The substrate may be a bare substrate or have one or more layers of material deposited thereon and/or features formed therein.

The boron-containing precursor may be diborane ($B_2H_6$), borazine ($B_3N_3H_6$), or an alkyl-substituted derivative of borazine. The boron-containing precursor may be introduced into the chamber at a flow rate between about 5 sccm and about 50 slm, such as between about 10 sccm and about 1 slm. Typically, the boron-containing precursor is introduced into the chamber with nitrogen ($N_2$), hydrogen ($H_2$), argon (Ar) or a combination thereof as a dilution gas. The dilution gas may be introduced into the chamber at a flow rate between about 5 sccm and about 50 slm, such as between about 1 slm and about 10 slm.

In embodiments in which the boron nitride film that may be formed in step 106 of FIG. 1 is a doped boron nitride film, a compound selected from the group consisting of a silicon-containing compound, a carbon-containing compound, a phosphorous-containing compound, and combinations thereof may also be introduced into the chamber during the deposition of the boron-containing film. Alternatively, the compound may be introduced into the chamber before or after the deposition of the boron-containing film. Example of nitrogen-containing compounds that may be used include ammonia ($NH_3$), hydrazine ($N_2H_4$). Example of oxygen-containing compounds include oxygen ($O_2$), nitric oxide (NO), nitrous oxide ($N_2O$), carbon dioxide ($CO_2$), and water ($H_2O$). Examples of silicon-containing compounds that may be used include silane, trisilylamine (TSA), trimethylsilane (TMS), and silazanes, such as hexamethylcyclotrisilazane (HMCTZ). Examples of carbon-containing compounds that may be used include hydrocarbon compounds having the general formula $C_xH_y$, such as alkanes, alkenes, and alkynes. An example of a phosphorous-containing compound that may be used is phosphine ($PH_3$).

The boron-containing film may be deposited on the substrate in the chamber from the boron-containing precursor in the presence or absence of a plasma in the chamber.

For deposition of the boron-containing film in the absence of a plasma in the chamber, the temperature of a substrate support in the chamber may be set to between about 100° C. and about 1000° C., e.g., between about 300° C. and about 500° C., and the pressure in the chamber may be between about 10 mTorr and about 760 Torr, e.g., between about 2 Torr and about 10 Torr, during the deposition. A combination of boron-containing, nitrogen-containing, carbon-containing, oxygen-containing and silicon-containing compounds may be introduced in the chamber at the same time at a flow rate between about 5 sccm and about 50 slm, such as between 10 sccm and about 1 slm.

For deposition of the boron-containing film in the presence of a plasma in the chamber, the temperature of a substrate support in the chamber may be set to between about 100° C. and about 1000° C., e.g., between about 300° C. and about 500° C., and the pressure in the chamber may be between about 10 mTorr and about 760 Torr, e.g., between about 2 Torr and about 10 Torr, during the deposition. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W.

Returning to step 106, after the boron-containing film is deposited, the boron-containing film is treated to modify its composition by incorporating nitrogen or oxygen into the film and form a boron nitride or boron oxide film. The boron nitride or boron oxide film may have a thickness of between about 2 Å and about 5000 Å. The treatment is selected from the group consisting of a plasma process, an ultraviolet (UV) cure process, a thermal anneal process, and combinations thereof, and comprises exposing the boron-containing film to a nitrogen-containing precursor to incorporate nitrogen into the film and form the boron nitride film. The nitrogen-containing precursor may be nitrogen gas ($N_2$), ammonia ($NH_3$), or hydrazine ($N_2H_4$), for example. The nitrogen-containing precursor may be diluted with a dilution gas such as argon, helium, hydrogen, or xenon. Exposing the boron-containing film to a oxygen-containing precursor allows incorporation of oxygen in the film and formation of a boron oxide film. The oxygen-containing precursor may be oxygen gas ($O_2$), nitrous oxide ($N_2O$) or carbon dioxide ($CO_2$).

In embodiments in which the treatment comprises a plasma process, the plasma process may be performed in the same chamber in which the boron-containing film was deposited or a different chamber. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W. The nitrogen-containing precursor may be introduced into the chamber at a flow rate of between about 5 sccm and about 50 slm, such as between about 100 sccm and about 500 sccm, during the treatment. The nitrogen-containing precursor may be flowed into the chamber for a period of time, such as between about 1 second and about 2 hours, such as between about 1 second and about 60 seconds. The chamber pressure may be between about 10 mTorr and about 760 Torr, and the temperature of a substrate support in the chamber may be between about 20° C. and about 1000° C. during the treatment. increased high frequency RF power, increased $NH_3$ flow rates, and longer treatment times of the plasma process can be used to lower the refractive index of the resulting films and increase the dielectric properties of the films.

In embodiments in which the treatment comprises a UV cure process, the UV cure process may be performed in the same chamber as the deposition chamber or in a chamber which is part of an integrated tool that includes the deposition chamber in which the boron-containing film was deposited. For example, the UV cure process may be performed in a NANOCURE™ chamber that is part of a PRODUCER® platform that includes a PECVD chamber in which the boron-containing film is deposited.

Exemplary UV cure process conditions that may be used include a chamber pressure of between about 10 mTorr and about 760 Torr and a substrate support temperature of between about 20° C. and about 1000° C. The nitrogen-containing precursor may be introduced into the chamber at a flow rate of between about 5 sccm and about 50 sccm during the treatment. The nitrogen-containing precursor may be flowed into the chamber for a period of time such as between about 1 second and about 2 hours, such as between about 1 second and about 10 minutes. The UV radiation may be provided by any UV source, such as mercury microwave arc lamps, pulsed xenon flash lamps, or high-efficiency UV light emitting diode arrays. The UV radiation may have a wavelength of between about 170 nm and about 400 nm, for example. The treatment may comprise exposing the boron-containing film to between about 1 Watt/$cm^2$ and about 1000 Watts/$cm^2$ of ultraviolet radiation, and the ultraviolet radiation may provide a photon energy (electronVolts) between about 0.5 eV and about 10 eV, such as between about 1 eV and about 6 eV.

Typically, the UV cure process removes hydrogen from the film, which is desirable as hydrogen can diffuse through the film and into semiconducting regions of the substrate and degrade reliability of a device formed on the substrate. The UV cure process also typically densifies the film and increases the tensile stress of the film to greater than about 2.0 GPa.

In embodiments in which the treatment comprises a thermal process, the thermal process may be performed in the same chamber in which the boron-containing film was deposited or a different chamber. The nitrogen-containing precursor may be introduced into the chamber at a flow rate of between about 5 sccm and about 50 slm, such as between about 10 sccm and about 1 slm, during the treatment. The nitrogen-containing precursor may be flowed into the chamber for a period of time such as between about 1 second and about 10 hours, such as between 10 seconds and about 20 minutes. The chamber pressure may be between about 10 mTorr and about 760 Torr, and the temperature of a substrate support in the chamber may be between about 20° C. and about 1000° C. during the treatment.

Further embodiments include treating the boron-containing film with two or more of the treatments described above, i.e., UV cure processes, plasma processes, and thermal processes. For example, the boron-containing film may be treated with a UV cure process and then a plasma process.

For applications in which high step coverage and a minimal pattern loading effect are required, such as when the boron nitride film is deposited as a spacer layer over a gate stack, multiple cycles of steps 102, 104, and 106 may be performed. In other words, after step 106, the boron-containing precursor is introduced into the chamber, an additional amount of the boron-containing film is deposited on the substrate, and the boron-containing film is treated with a process selected from the group consisting of a plasma process, a UV cure process, a thermal anneal process, and combinations thereof, wherein the treating comprises exposing the boron-containing film to a nitrogen-containing precursor to incorporate nitrogen or to an oxygen-containing precursor to incorporate oxygen into the film and form a boron nitride or boron oxide film respectively. Steps 102, 104, and 106 may be repeated until a desired thickness of the boron nitride film is obtained. By forming thin sub-layers of the final boron nitride or boron oxide film, such as about 2 Å to about 5000 Å layers, for example, about 2 Å to about 1000 Å, e.g., about 20 Å layers, in each cycle, the step coverage and pattern loading effect can be improved relative to processes in which the film is deposited to the final desired thickness in one cycle. For example, a step coverage of greater than 95% and a pattern loading effect of less than 5% were obtained when a boron nitride film was formed under the following conditions: depositing a boron-containing film at a deposition rate of 20 Å per cycle using 400 sccm of diborane and 2000 sccm of nitrogen at a chamber pressure of 6 Torr and a spacing of 480 mils for 5 seconds/cycle; and treating the boron-containing film with a plasma process to incorporate nitrogen into the film and form a boron nitride film, wherein the plasma process comprises using 100 sccm of ammonia and 2000 sccm of nitrogen for 10 seconds/cycle with 300 W of RF power at 13.6 MHz. The boron nitride film had a dielectric constant of 4.7. The refractive index at 500 Å was 1.810, and the density was 2.4 g/cm$^3$. The leakage current at 1 MV was $3e^{-09}$ amps/cm$^2$, and the leakage current at 2 MV was $4e^{-08}$ amps/cm$^2$. The breakdown voltage (Vbd) was 5 MV/cm.

In further examples, boron nitride films for use as stress nitride layers were deposited under the following conditions: depositing a boron-containing film using a 25 or 50 sccm flow of diborane at a chamber pressure of 6 Torr and a spacing of 480 mils at a substrate support temperature of 400° C. for 10 seconds and then treating the boron-containing film with a plasma to incorporate nitrogen into the film and form a boron nitride film, wherein the plasma process comprises using 100 sccm of ammonia and 2000 sccm of nitrogen for 10 seconds/cycle with 100 W of RF power at 13.6 MHz. The deposition of the boron-containing film and the plasma treatment were repeated for 10 cycles. The film deposited using 25 sccm of diborane had a sidewall/top step coverage of 100% and a bottom/top step coverage of 98%. The film deposited using 50 sccm of diborane had a sidewall/top step coverage of 99% and a bottom/top step coverage of 100%. The films were also shown to be thermally stable after 30 minutes of annealing at 900° C. Thus, the films provided herein exhibit desirable high densities and electrical properties.

Figure 2:
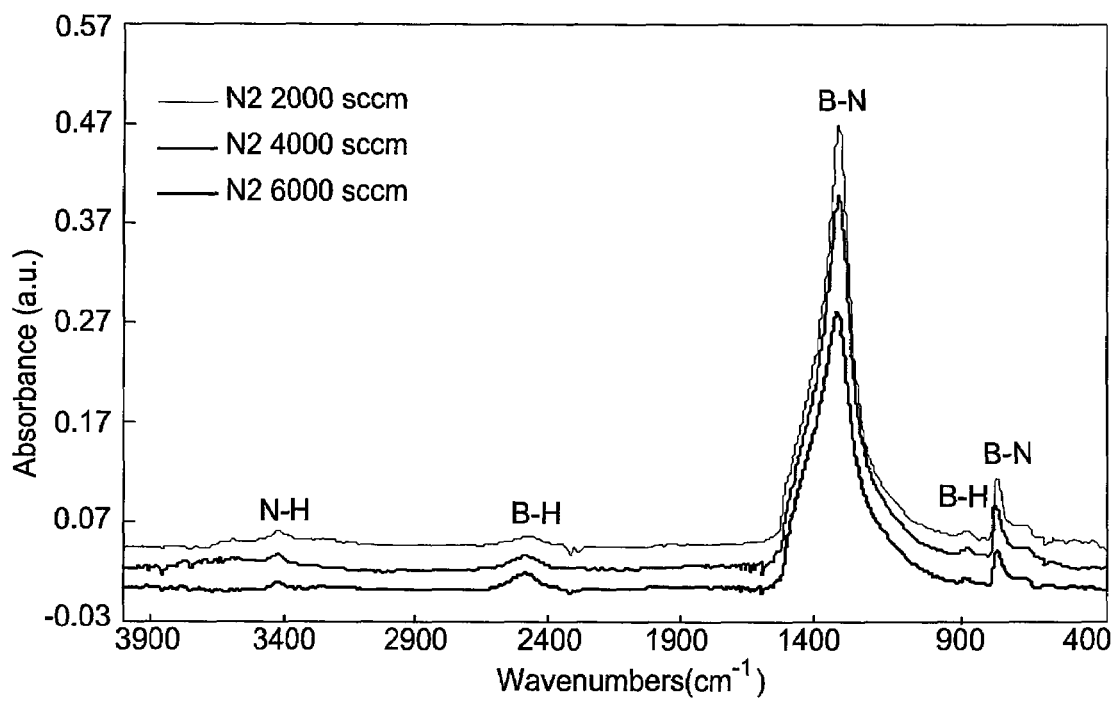
FIG. 2 is a FTIR that shows the effect of different $N_2$ flow rates during treatment of boron-containing films with $N_2$ on the composition of resulting boron nitride layers according to embodiments of the invention.

FIG. 2 is a FTIR that shows the effect of different $N_2$ flow rates during treatment of boron-containing films with $N_2$ on the composition of the resulting boron nitride layers. FIG. 2 illustrates that the composition of the boron nitride layer can be modulated by tuning the flow rate of the nitrogen-containing precursor during the treatment of the boron-containing film with nitrogen. It was also found that using a lower flow rate of diborane provides boron nitride films with a higher nitrogen content and a lower refractive index.

Figure 3:
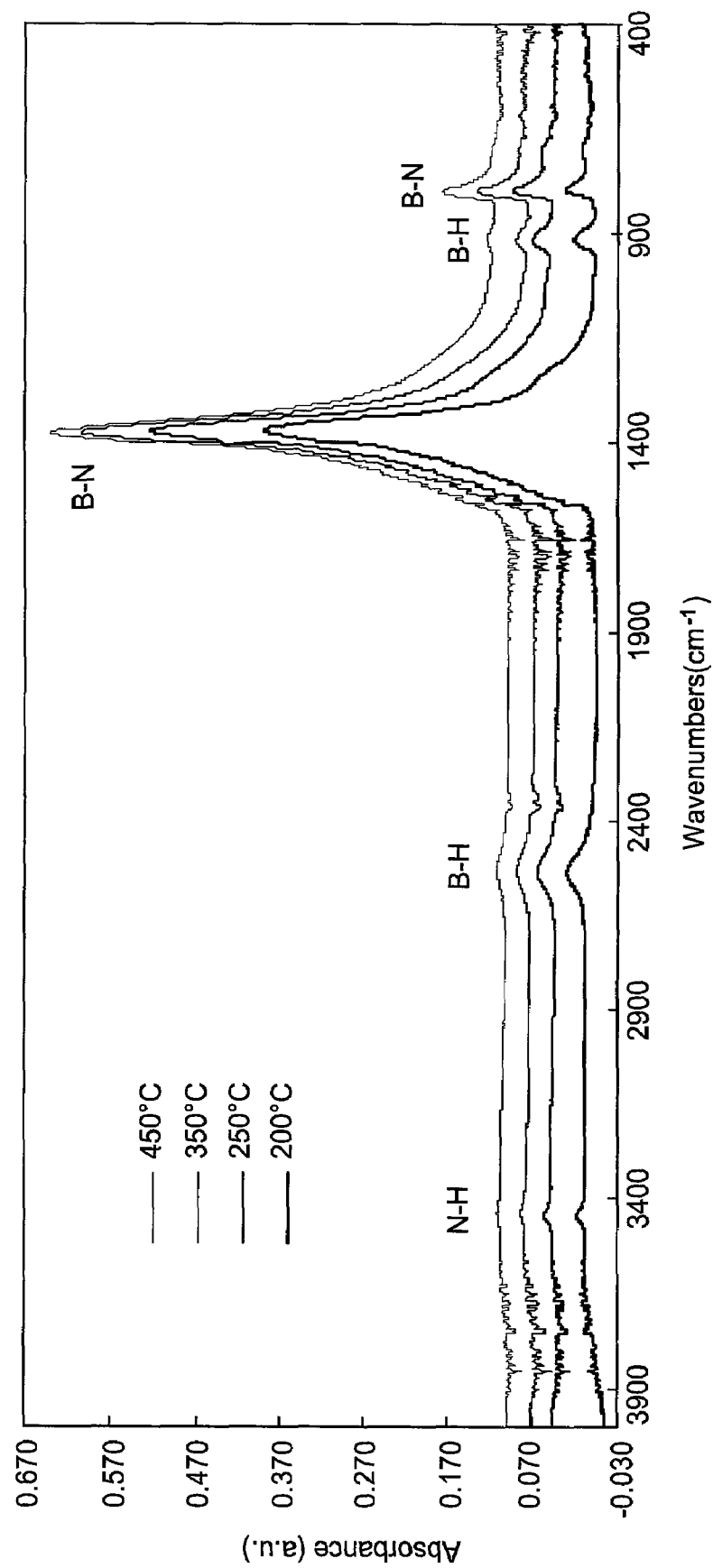
FIG. 3 is a FTIR that shows the effect of different substrate support temperatures during the deposition of boron-containing films on the composition of the subsequently formed boron nitride layers according to embodiments of the invention.

FIG. 3 is a FTIR that shows the effect of different substrate support temperatures during the deposition of boron-containing films on the composition of the subsequently formed boron nitride layers. FIG. 3 illustrates that the composition of the boron nitride layer can also be modulated by tuning the substrate support temperature.

In addition to film composition, other properties of the boron nitride films, such as refractive index (RI) and step coverage, can be tailored by introducing other precursors into the chamber during the introduction of the boron-containing precursor in step 102. Films deposited using $B_2H_6$, $B_2H_6$+$NH_3$, $B_2H_6$+$SiH_4$, and $B_2H_6$+$NH_3$+$SiH_4$ during step 102 were compared. The $B_2H_6$+$SiH_4$ films had the highest refractive index. Films that were deposited using an additional precursor rather than $B_2H_6$ alone had improved uniformity. The $B_2H_6$+$NH_3$+$SiH_4$ films had the best step coverage. For example, a bottom/top step coverage of 91%, a sidewall/top step coverage of 91%, a top PLE of 0%, a sidewall PLE of 7%, and a bottom PLE of 5% were obtained using the following conditions: 400 sccm $B_2H_6$ (5% in $N_2$), 40 sccm $SiH_4$, 200 sccm $NH_3$, 4000 sccm $N_2$ for 15 seconds followed by a nitrogen plasma treatment comprising 600 W RF power at 13.6 MHz, 100 sccm $NH_3$, and 6000 sccm $N_2$ for 15 seconds.

While a substrate is exposed to the boron-containing precursor and the nitrogen-containing precursor sequentially in the embodiments described with respect to FIG. 1, in alternative embodiments, a substrate is exposed to the boron-containing precursor and the nitrogen-containing precursor (and/or an oxygen-containing) precursor simultaneously. In such embodiments, the boron-containing precursor and the nitrogen-containing or oxygen-containing precursor are introduced into a chamber and then reacted to chemically vapor deposit a boron nitride or boron oxide film on a substrate in the chamber. Optionally, a silicon-containing compound, a carbon-containing compound, a phosphorous-containing compound, or combination thereof may also be introduced into the chamber at the same time to deposit a doped boron nitride film. The reaction of the boron-containing precursor, the nitrogen-containing or oxygen-containing precursor, and the optional other compounds may be performed in the presence or absence of a plasma in the chamber.

By introducing the precursors simultaneously, a higher deposition rate may be achieved. Thus, embodiments in which the substrate is exposed to the boron-containing precursor and the nitrogen-containing precursor simultaneously provide desirable methods of forming boron nitride films for applications which do not have high step coverage and pattern loading requirements, such as for hard mask layers.

The boron-containing precursor and the nitrogen-containing precursor may be any of the precursors described above with respect to the embodiments of FIG. 1. Similarly, the chamber and substrate may be any of the chambers and substrates, respectively, described above with respect to the embodiments of FIG. 1.

The boron-containing precursor may be introduced into the chamber with nitrogen ($N_2$), hydrogen ($H_2$), argon (Ar) or a combination thereof as a dilution gas. The boron-containing precursor may be introduced into the chamber at a flow rate between about 5 sccm and about 50 slm, such as between about 10 sccm and about 1 slm. The nitrogen-containing precursor may be introduced into the chamber at a flow rate between about 5 sccm and about 50 slm, such as between about 10 sccm and about 1 slm. The dilution gas may be introduced into the chamber at a flow rate between about 5 sccm and about 50 slm, such as between about 1 slm and about 10 slm.

In embodiments in which the boron-containing precursor and the nitrogen-containing precursor are reacted in the presence of a plasma, a chamber pressure of between about 10 mTorr and about 760 Torr, e.g., between about 2 Torr and about 10 Torr, and a substrate support temperature of between about 100° C. and about 1000° C., e.g., between about 300° C. and about 500° C., may be used during the deposition. The spacing between a showerhead of the chamber and the substrate support may be between about 100 mils and about 10000 mils. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W.

The embodiments in which the boron-containing precursor and the nitrogen-containing precursor are reacted in the presence of a plasma provide boron nitride films that have properties that are desirable for hard mask applications. For example, wet etch rate ratios (100:1 HF) of 0.03 and 0.3 for thermal oxide and thermal nitride, respectively, have been obtained. Argon may be added to the precursor mixture to lower the dielectric constant of the films and increase the breakdown voltage. These films also have properties that are desirable for back-end of line applications such as copper barrier layers. In an exemplary embodiment, diborane diluted with nitrogen and ammonia are introduced into a chamber and reacted in the presence of a plasma provided by RF power to deposit a boron nitride film on a substrate in the chamber. The diborane was introduced into the chamber at a flow rate of about 3000 sccm, 5% in $N_2$, and the ammonia was introduced into the chamber at a flow rate of about 150 sccm. The RF power was provided at about 300 W at a frequency of 13.6 MHz. The chamber pressure was about 6 Torr, and the spacing was about 480 mils. Boron nitride films with low wet etch rates, high deposition rates, and desirable, low dielectric constants were obtained.

In embodiments in which the boron-containing precursor and the nitrogen-containing, oxygen-containing, carbon-containing and/or silicon-containing precursor are reacted in the absence of a plasma, a chamber pressure of between about 10 mTorr and about 760 Torr and a substrate support temperature of between about 100° C. and about 1000° C. may be used during the deposition. The spacing between a showerhead of the chamber and the substrate support may be between about 50 mils and about 5000 mils.

In a further embodiment in which the boron-containing precursor and the nitrogen-containing precursor are introduced simultaneously, a silicon-containing precursor may also be introduced into the chamber with the boron-containing precursor and the nitrogen-containing precursor to form a SiBN film for spacer applications. The SiBN film may have a dielectric constant of less than 5.5, a breakdown voltage of greater than 6 MV/cm, and a leakage current of less than $1e^{-9}$ amps/cm$^2$ at 2 MV. Exemplary processing conditions for depositing a SiBN film include: 60 sccm $SiH_4$, 600 sccm $NH_3$, 1000 sccm $N_2$, 100-1000 sccm $B_2H_6$, 100 W RF power at 13.6 MHz, a chamber pressure of 6 Torr, and a spacing of 480 mils. Optionally, the SiBN film may be UV cured for 10 minutes at 400° C.

While the foregoing is directed to embodiments of the present invention, other and further embodiments of the invention may be devised without departing from the basic scope thereof, and the scope thereof is determined by the claims that follow.

What is claimed is:

1. A method of forming a boron nitride film or boron oxide film, comprising:
   introducing a boron-containing precursor into a chamber;
   depositing a boron-containing film in the presence of a plasma on a substrate in the chamber from the boron-containing precursor;
   after depositing the boron-containing film, treating the boron-containing film with a nitrogen-containing precursor in a first plasma process to incorporate nitrogen or oxygen in the film and form a boron nitride film or boron oxide film; and
   repeating the introducing, the depositing, and the treating until a desired thickness of the boron nitride film or boron oxide film is obtained.

2. The method of claim 1, wherein the boron oxide film and the boron nitride film are boron-doped oxide films and boron-doped nitride films respectively.

3. The method of claim 2, wherein the boron nitride film is a spacer or stress nitride layer having a stress between 10 GPa compressive and 10 GPa tensile.

4. The method of claim 2, further comprising using the boron nitride film or the boron oxide film to dope an underlying layer or an above layer with boron.

5. The method of claim 2, wherein the boron nitride film or the boron oxide film is used as a boron diffusion barrier below or above a boron-rich film, and the boron nitride film or the boron oxide film has a lower boron atomic percent concentration than the boron-rich film.

6. The method of claim 2, wherein the boron nitride film or the boron oxide film is a copper barrier layer.

7. The method of claim 2, wherein the boron oxide film or the boron nitride film is an adhesion layer between copper and a copper barrier layer.

8. The method of claim 2, wherein the boron nitride film has a dielectric constant between 1.1 and 10.

9. The method of claim 1, further comprising introducing a nitrogen-containing compound, an oxygen-containing compound, a silicon-containing compound, a carbon-containing compound, a phosphorous-containing compound, or a combination thereof into the chamber during the deposition of the boron-containing film, and the boron-containing film is a doped boron nitride film or a doped boron oxide film.

10. The method of claim 9, wherein the silicon-containing compound is selected from the group consisting of silane, trisilylamine (TSA), trimethylsilane (TMS), and silazanes.

11. The method of claim 9, wherein the oxygen-containing compound is selected from the group consisting of oxygen gas, nitric oxide (NO), nitrous oxide ($N_2O$), carbon dioxide ($CO_2$), and water ($H_2O$).

12. The method of claim 9, wherein the carbon-containing compound comprises a hydrocarbon compound having the general formula $C_xH_y$.

13. The method of claim 9, wherein a phosphorous-containing compound is introduced into the chamber during the deposition of the boron-containing film, and the phosphorus-containing compound is phosphine.

14. The method of claim 1, wherein the boron-containing precursor is selected from the group consisting of diborane, borazine, and alkyl-substituted derivatives of borazine.

15. The method of claim 1, wherein the nitrogen-containing precursor is selected from the group consisting of ammonia, nitrogen gas, and hydrazine.

16. The method of claim 1, wherein the treating the boron-containing film further comprises exposing the boron-containing film to a second plasma process, a UV cure process, a thermal anneal process, or a combination thereof.

17. The method of claim 1, wherein the thickness of the film obtained in the depositing the boron-containing film is between 2 Å and 1000 Å.

* * * * *